(12) United States Patent
Kabe et al.

(10) Patent No.: US 7,464,586 B2
(45) Date of Patent: Dec. 16, 2008

(54) TIRE DESIGNING METHOD AND PROGRAM

(75) Inventors: Kazuyuki Kabe, Kanagawa (JP); Keita Rachi, Kanagawa (JP)

(73) Assignee: The Yokohama Rubber Co., Ltd., Tokyo (JP)

( * ) Notice: Subject to any disclaimer, the term of this patent is extended or adjusted under 35 U.S.C. 154(b) by 580 days.

(21) Appl. No.: 10/557,030

(22) PCT Filed: May 17, 2004

(86) PCT No.: PCT/JP2004/006978

§ 371 (c)(1), (2), (4) Date: Nov. 16, 2005

(87) PCT Pub. No.: WO2004/101297

PCT Pub. Date: Nov. 25, 2004

(65) Prior Publication Data

US 2007/0073456 A1    Mar. 29, 2007

(30) Foreign Application Priority Data

May 16, 2003  (JP)  ............... 2003-138483
Mar. 18, 2004  (JP)  ............... 2004-078327

(51) Int. Cl.
*G01M 17/02* (2006.01)
(52) U.S. Cl. ....................................... 73/146
(58) Field of Classification Search ............ 73/146, 73/146.5; 701/82; 703/8
See application file for complete search history.

(56) References Cited

U.S. PATENT DOCUMENTS 6,868,716 B2 *  3/2005  Okano et al. ................ 73/146

(Continued)

FOREIGN PATENT DOCUMENTS

JP      11-201874      7/1999

(Continued)

OTHER PUBLICATIONS

English Translation of PCT Notification of Transmittal of Translation of the International Preliminary Report on Patentability; Form PCT/IB/338 mailed Mar. 23, 2006.

(Continued)

*Primary Examiner*—Andre J Allen
(74) *Attorney, Agent, or Firm*—Knobbe, Martens, Olson & Bear LLP (57) ABSTRACT

In a tire designing method, at least one of a tire profile shape, a shape of a tire component member and physical property data of the tire component member is tentatively selected as a parameter to prepare an initial tire model (30) representing the pneumatic tire by using a finite number of elements, and at least one of a stress acting on the initial tire model by the inner pressure filling processing and the physical property data used for the initial tire model is modified corresponding to a predetermined measure of elapsed time, to thereby deform the initial tire model and a tire profile shape after a change with time is predicted by using the deformed initial tire model. By preparing the tire model (30) with the predicted tire profile shape and applying the inner pressure filling processing and road contact processing thereto, the maximum principal strains in the elements of the tire model (30) are calculated, and the margins of safety of the tire component members are calculated by using the maximum principal strains. The tentatively selection is repeated until the calculated margins are equal to or larger than a pre-set reference margin of safety so that a tire with excellent durability can be designed.

9 Claims, 6 Drawing Sheets

U.S. PATENT DOCUMENTS

| | | | |
|---|---|---|---|
| 7,133,736 B2 * | 11/2006 | Caretta et al. | 700/117 |
| 2002/0014294 A1 * | 2/2002 | Okano et al. | 152/454 |
| 2007/0233352 A1 * | 10/2007 | Miyashita et al. | 701/82 |
| 2008/0059134 A1 * | 3/2008 | Miyashita et al. | 703/8 |

FOREIGN PATENT DOCUMENTS

| | | |
|---|---|---|
| JP | 2000-141509 | 5/2000 |
| JP | 2002-099579 | 4/2002 |
| JP | 2002-192924 A | 7/2002 |
| JP | 2003-020072 A | 1/2003 |
| JP | 2004-210106 A | 7/2004 |

OTHER PUBLICATIONS

English Translation of International Preliminary Report on Patentability; Form PCT/IB/373 mailed Mar. 16, 2006.
English Translation of PCT Written Opinion of the International Search Authority; Form PCT/ISA/237 mailed Mar. 16, 2006.
International Search Report.

* cited by examiner

TIRE DESIGNING METHOD AND PROGRAM

TECHNICAL FIELD

The present invention relates to a tire designing method of predicting a change with time, which is caused by the use of a pneumatic tire, by using a tire model to design a tire and to a program for executing the designing method. More particularly, the present invention relates to a tire designing method of efficiently determining parameters such as a tire profile shape, a shape of a tire component member and a physical property data of the tire component member when a pneumatic tire excellent in tire durability is to be designed and to a program for executing the designing method.

BACKGROUND ART

In these days, various methods of using a finite element (FE) model obtained by dividing a pneumatic tire (hereinafter, referred to as tire) into a plurality of finite elements to predict tire properties including tire durability for designing a tire based on the predicted tire properties have been proposed.

Any of those methods uses a computer to prepare a finite element model. The prepared finite element model is used to reproduce a desired static state or dynamic state. Then, a mechanical physical quantity in the reproduced state is calculated to evaluate tire characteristics. As a result, a tire sectional shape of the finite element model excellent in tire properties can be obtained, thereby enabling efficient tire designing.

For example, the following Patent Documents 1 to 3 disclose a method of analyzing a desired tire property of a pneumatic tire. Based on the analyzed tire property, a tire can be designed.

JP 2000-141509 A discloses tire designing based on tire performance through a fluid, such as drainability, performance on snow and noise performance, using a tire model according to a finite element method.

JP 11-201874 A discloses a simulation method of predicting a vibration characteristic of a tire by using a tire model according to a finite element method.

JP 2002-99579 A discloses a method of calculating a fluctuation error in characteristics such as durability of a target object such as a tire when a variation in a manufacturing process or a component member or a fluctuation in usage conditions or the like occurs. By using the result of calculation, a design proposal exhibiting stable performance is obtained.

On the other hand, JP 2002-192924 A discloses a method of defining a margin of safety by using a breaking strain, a breaking stress or a breaking strain energy density, which is proper to a material of a tire component member, so that the result of a durability simulation of a tire according to finite element analysis of the tire is identical with the actual result of the durability of the tire, thereby designing a tire excellent in durability.

Although tires actually manufactured by the above-described methods have a desired tire property, the tire property changes with the use of the tire to be completely different from that in an initial state in many cases. Moreover, even if the tire property is good in the initial state, the tire property is sometimes greatly degraded with use.

Such a change in tire properties is due to a change of a tire shape with time, which is caused depending on usage conditions or a use environment of the tire. For example, an outer diameter of a tire is increased to change a sectional shape of the tire. Specifically, the tire properties are greatly affected by a change in tire profile shape (tire sectional shape), which is caused by a change with time with the use of the tire. In particular, the durability is greatly affected by the tire profile shape that constantly changes with the use of the tire.

In conventional techniques including the above-mentioned Patent Documents, however, a tire profile shape change with time, which is caused by the use of the tire, cannot be predicted by using the finite element model to calculate a mechanical physical quantity of the durability after a change with time. Therefore, a tire excellent in durability cannot be designed in consideration of a change of a tire with time.

Accordingly, the present invention has an object to provide a tire designing method of predicting a tire profile shape change with time, which is caused by the use of a tire, by using a tire model to allow a tire excellent in durability to be designed and a program for executing the designing method.

DISCLOSURE OF THE INVENTION

In order to achieve the above object, the present invention provides a tire designing method of designing a tire by predicting a change with time, which is caused by use of a pneumatic tire, the method including: a model preparing step of tentatively selecting at least one of a tire profile shape, a shape of a tire component member and physical property data of the tire component member as a parameter to prepare an initial tire model representing the pneumatic tire by using a finite number of elements; an inner pressure filling processing step of performing a first inner pressure filling processing on the prepared initial tire model; a time-varying change predicting step of modifying at least one of a stress acting on the initial tire model by the first inner pressure filling processing and the physical property data used for the initial tire model corresponding to a predetermined measure of elapsed time to deform the initial tire model and predicting a tire profile shape after a change with time by using the deformed initial tire model; a margin of safety calculating step of performing at least a second inner pressure filling processing on the tire model after the change with time, the tire model having the tire profile shape after the change with time, to calculate at least one mechanical characteristic quantity of a maximum principal strain, a maximum principal stress and a maximum strain energy density in each element of the tire component member in the tire model filled with the inner pressure after the change with time and using the thus calculated mechanical characteristic quantity to calculate margins of safety of the tire component member; a repeat step of repeating the model preparing step, the inner pressure filling processing step, the time-varying change predicting step and the margin of safety calculating step until the calculated margins become equal to or larger than a preset reference margin of safety; and a parameter determining step of determining the tentatively selected parameter, with which the margins of safety become equal to or larger than the reference margin, as a design parameter of a tire.

Herein, the measure of elapsed time is a parameter indicating time elapsed with the use of the tire. The measure has complete additivity, according to which values of the measure indicating elapsed time for the respective uses are accumulatively added when the use of the tire occurs separately. Generally, the measure is a mathematical abstract concept such as a length, an area, a volume and time.

Herein, it is preferred that the measure of elapsed time is determined by a ratio of a groove depth of a remaining groove of a tire tread portion to an initial groove depth or a running distance of a pneumatic tire. It is preferred that a plurality of different measures of elapsed time are given in the time-varying change predicting step to predict a change of the tire with time at a plurality of stages. It is also preferred that the model preparing step, the inner pressure filling processing step, the time-varying change predicting step and the margin of safety calculating step are repeated until all the margins of safety of the changes of the tire with time at the plurality of stages become equal to or larger than the reference margin in the repeat step.

Moreover, it is preferred to perform a road contact processing on the tire model in addition to the second inner pressure filling processing in the margin of safety calculating step.

Moreover, in the time-varying change predicting step, when the initial tire model is deformed to predict the tire profile shape after a change with time, it is preferred to prepare an adjustment tire model having a tire profile shape of the initial tire model deformed by the first inner pressure filling processing as a tire profile shape before a subsequent third inner pressure filling processing. A tire profile shape obtained by performing the third inner pressure filling processing on the adjustment tire model is predicted as a tire profile shape of the pneumatic tire after a change with time. At this time, the adjustment tire model may have as an initial stress a value obtained by modifying a stress acting on the initial tire model when the first inner pressure filling processing is performed on the initial tire model.

Moreover, in the time-varying change predicting step, the following is similarly preferred. When the tire profile shape after the change with time is predicted by deforming the initial tire model, the third inner pressure filling processing is performed for a plurality of times. When defining as a modification processing a processing of preparing the adjustment model having the tire profile shape of the tire model deformed by the third inner pressure filling processing as the tire profile shape prior to the further third inner pressure filling processing, the modification processing is performed using a tire model first to be subjected to the modification processing as the initial tire model deformed by the first inner pressure filling processing. The adjustment tire model prepared by the modification processing is used as a tire model to be further subjected to the modification processing. Then, the modification processing is repeated for a predetermined number of times. A tire profile shape of the last prepared adjustment tire model is predicted as a tire profile shape of the pneumatic tire after the change with time. At this time, the adjustment tire model prepared by the modification processing may have as an initial stress a value obtained by modifying the stress acting on the tire model when the inner pressure filling processing is performed on the tire model to be subjected to the modification processing.

Moreover, in the time-varying change predicting step, when the physical property data of the tire component member in the initial tire model is modified, it is preferred to modify at least one of an elastic modulus and a Poisson ratio corresponding to a measure of elapsed time of the pneumatic tire as the modification of the physical property data. The elastic ratio and the Poisson ratio can be set according to a strain-stress curve obtained when a rubber member is deteriorated.

Furthermore, the present invention provides a program executable by a computer, for predicting a change with time caused by use of a pneumatic tire to allow the computer to design a tire, the program including: a model preparing procedure of allowing computing means of a computer to tentatively select at least one of a tire profile shape, a shape of a tire component member and a physical property data of the tire component member as a parameter and to prepare an initial tire model representing the pneumatic tire by using a finite number of elements; an inner pressure filling processing procedure of allowing the computing means to perform a calculation of a first inner pressure filling processing performed on the prepared initial tire model; a time-varying change predicting procedure of allowing the computing means to modify at least one of a stress acting on the initial tire model by first the inner pressure filling processing and the physical property data used for the initial tire model corresponding to a predetermined measure of elapsed time to deform the initial tire model and to predict a tire profile shape after a change with time by using the deformed initial tire model; a margin of safety calculating procedure of allowing the computing means to execute at least a calculation of a second inner pressure filling processing of the tire model after the change with time, which has a tire profile shape after the change with time, to calculate at least one mechanical characteristic quantity of a maximum principal strain, a maximum principal stress and a maximum strain energy density in each of the elements of the tire component members in the tire model after the change with time and to calculate a margin of safety of the tire component member in the tire model after the change with time by using the thus calculated mechanical characteristic quantity, whereby the margin of safety is stored in storage means of the computer; a repeating procedure of allowing the computer to repeat the model preparing procedure, the inner pressure filling processing procedure, the time-varying change predicting procedure and the margin of safety calculating procedure until the calculated margins of safety become equal to or larger than a reference margin of safety; and a parameter determining procedure of allowing the computer to determine the tentatively selected parameter, with which the calculated margins of safety become equal to or larger than the reference margin, as a design parameter of a tire.

BEST MODE FOR CARRYING OUT THE INVENTION

Hereinafter, a tire designing method and a program executable by a computer executing the method according to the present invention will be described in detail based on the preferred embodiments illustrated in the accompanying drawings.

Figure 1:
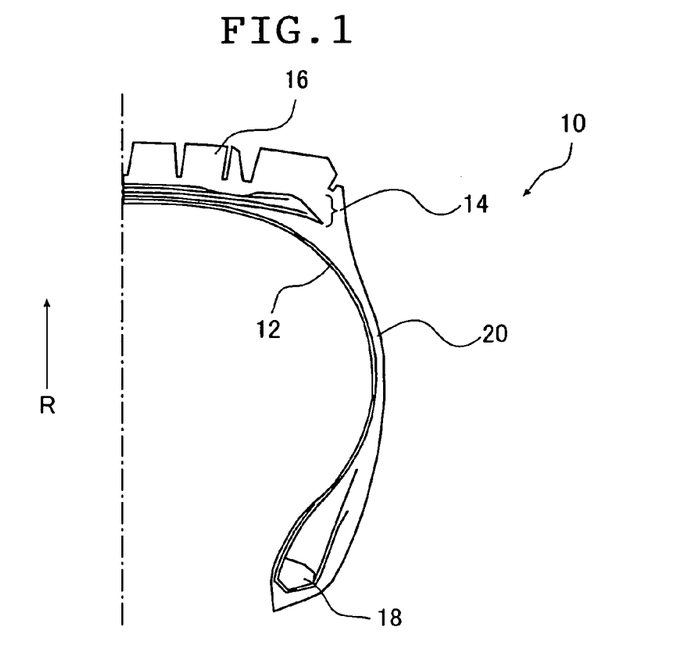
FIG. 1 is a sectional view showing an example of a structure of a sectional shape of a heavy-duty tire.

FIG. 1 shows an example of a structure of a sectional shape (a tire profile shape) of a heavy-duty tire (track/bus tire).

A pneumatic tire (hereinafter, referred to as tire) 10 mainly includes as tire component members: a carcass member 12; a belt member 14; a tread member 16; a bead member 18; and a side member 20.

The carcass member 12 is a tire frame obtained by coating a cord material such as a steel cord with a rubber material, whereas the belt member 14 is a tire frame that prevents the carcass member 12 from being expanded in a radial direction R while fastening it. The tread member 16 is a rubber member provided on the outer side of the belt member 14 in the radial direction, on which a tread pattern is formed coming in contact with a ground surface. The bead member 18 is a member formed of a steel material and a rubber member, which winds up an end of the carcass member 12 to fix the carcass member 12 and enables rim attachment. The side member 20 is a rubber member covering a surface of a tire side face.

Figure 2:
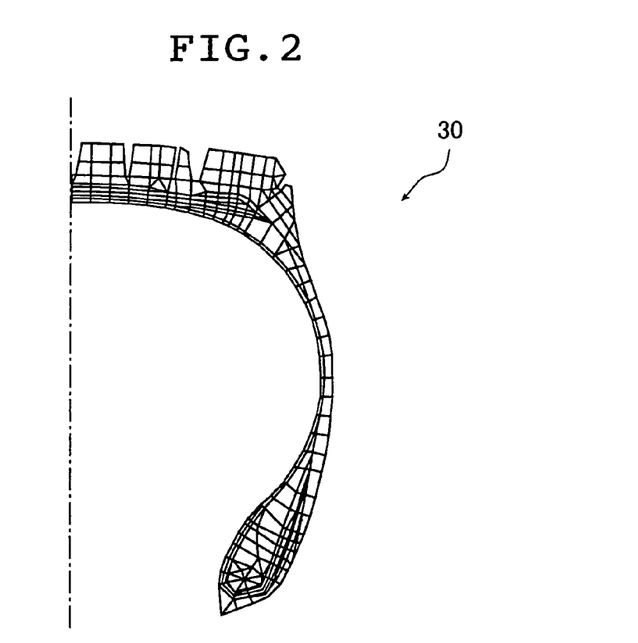
FIG. 2 is a view showing an example of a tire model used in a tire designing method according to the present invention.

An example of modeling the tire 10 as a finite element model is illustrated in FIG. 2.

A tire model 30 shown in FIG. 2 is obtained by dividing each of the component members including at least the carcass member 12, the belt member 14, the tread member 16, the bead member 18 and the side member 20 into a finite number of elements to approximate the tire 10. The elements of the tire model 30 include solid elements such as triangles or rectangles, membrane elements or shell elements.

The tire model 30 is prepared by setting information of a geometrical shape of each element (each finite element) and node positional information of each element. Furthermore, by setting material constants (physical property data) of each element, a calculable finite element model is obtained.

The tire model 30 shown in FIG. 2 represents a tire profile shape (hereinafter, referred to simply as tire shape) when the tire 10 is cut along the radial direction R including a tire rotational axis. As described below, when a change of a tire with time is predictively calculated using the tire model 30, the tire shape as shown in FIG. 2 is formed on a tire circumference. The calculation is performed for the tire model as an axially symmetric model having the degree of freedom of torsion in the tire circumferential direction.

Instead of preparing the tire model 30 as shown in FIG. 2, a three-dimensional tire model having a tire model as shown in FIG. 2 uniformly in the tire circumferential direction to include three-dimensional solid elements, three-dimensional membrane elements or three-dimensional shell elements may also be used.

Figure 3:
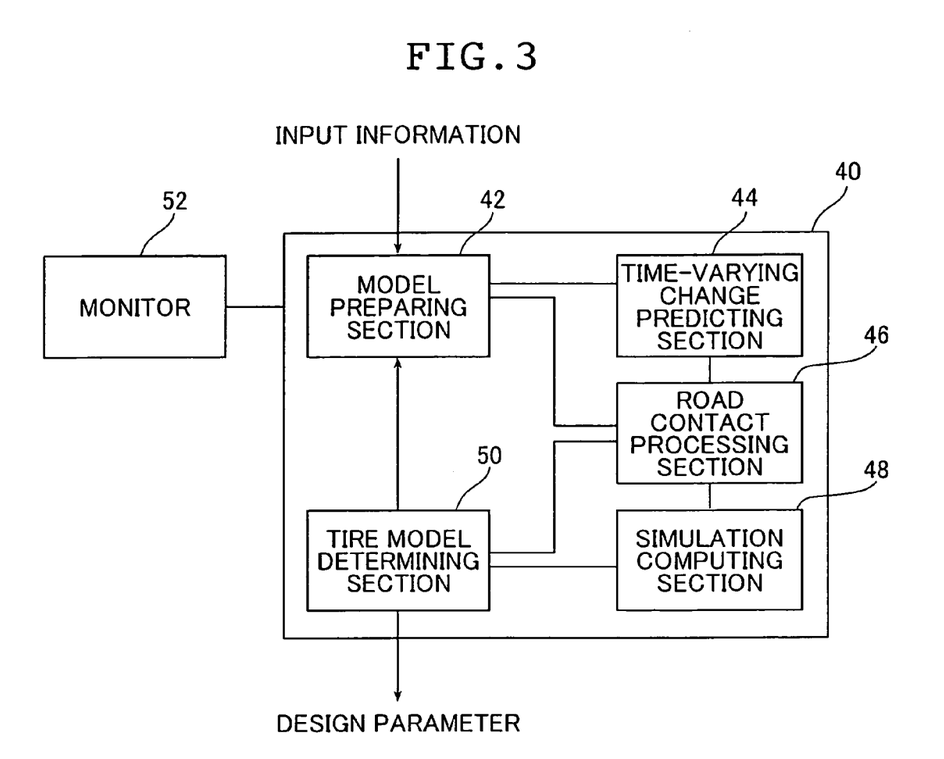
FIG. 3 is a block diagram showing an example of an apparatus for implementing the tire designing method according to the present invention.

FIG. 3 shows an apparatus for implementing the tire designing method according to the present invention.

An apparatus 40 shown in FIG. 3 includes: a model preparing section 42; a time-varying change predicting section 44; a road contact processing section 46; a simulation computing section 48; and a tire model determining section 50. A monitor 52 is connected to the apparatus 40.

The model preparing section 42 tentatively selects at least one of the tire shape, the shapes of the tire component members and the physical property data of the tire component members as a parameter based on input information to prepare the tire model 30 as an initial tire model. At the same time, the model preparing section 42 prepares a rim model to be merged with the tire model 30.

The time-varying change predicting section 44 performs a predetermined processing described below on the initial tire model prepared by the model preparing section 42 to prepare a tire model that has changed with time.

The road contact processing section 46 performs a processing of applying a load onto the prepared tire model that has changed with time to ground the tire model on a ground plane.

The simulation computing section 48 performs a predefined simulation calculation to calculate a mechanical physical property data characterizing the durability of the tire model that has changed with time. The mechanical physical property data is, for example, a maximum principal strain, a maximum principal stress or a maximum strain energy density of the tire component member in the tire model when the tire model that has changed with time, which is subjected to the road contact processing, rotates at a predetermined running speed, furthermore, when a slip angle is provided for the rotating tire model.

The tire model determining section 50 calculates margins of safety of the tire component members characterizing the durability in the tire model processed in the road contact processing section 46 or the simulation computing section 48 to determine whether all the calculated margins of safety are equal to or larger than a reference margin of safety or not. If each of the margins is equal to or larger than the reference margin, the margin of safety is determined as a design parameter of the tire to be output. If it is denied in the above determination, information indicating the denial is transmitted to the model preparing section 42 to instruct the model preparing section 42 to tentatively select a new parameter to prepare an initial tire model.

Herein, the margin of safety of the tire component member corresponds to a ratio of at least one mechanical property data of the maximum principal strain, the maximum principal stress and the maximum strain energy density in each of the elements of the tire component member in the tire model to a mechanical property data of the material itself of the tire component member at the breakage.

The monitor 50 is used to display an input screen used for entering input information, to display various prepared models, or to display the result of a simulation calculation.

Figure 4:
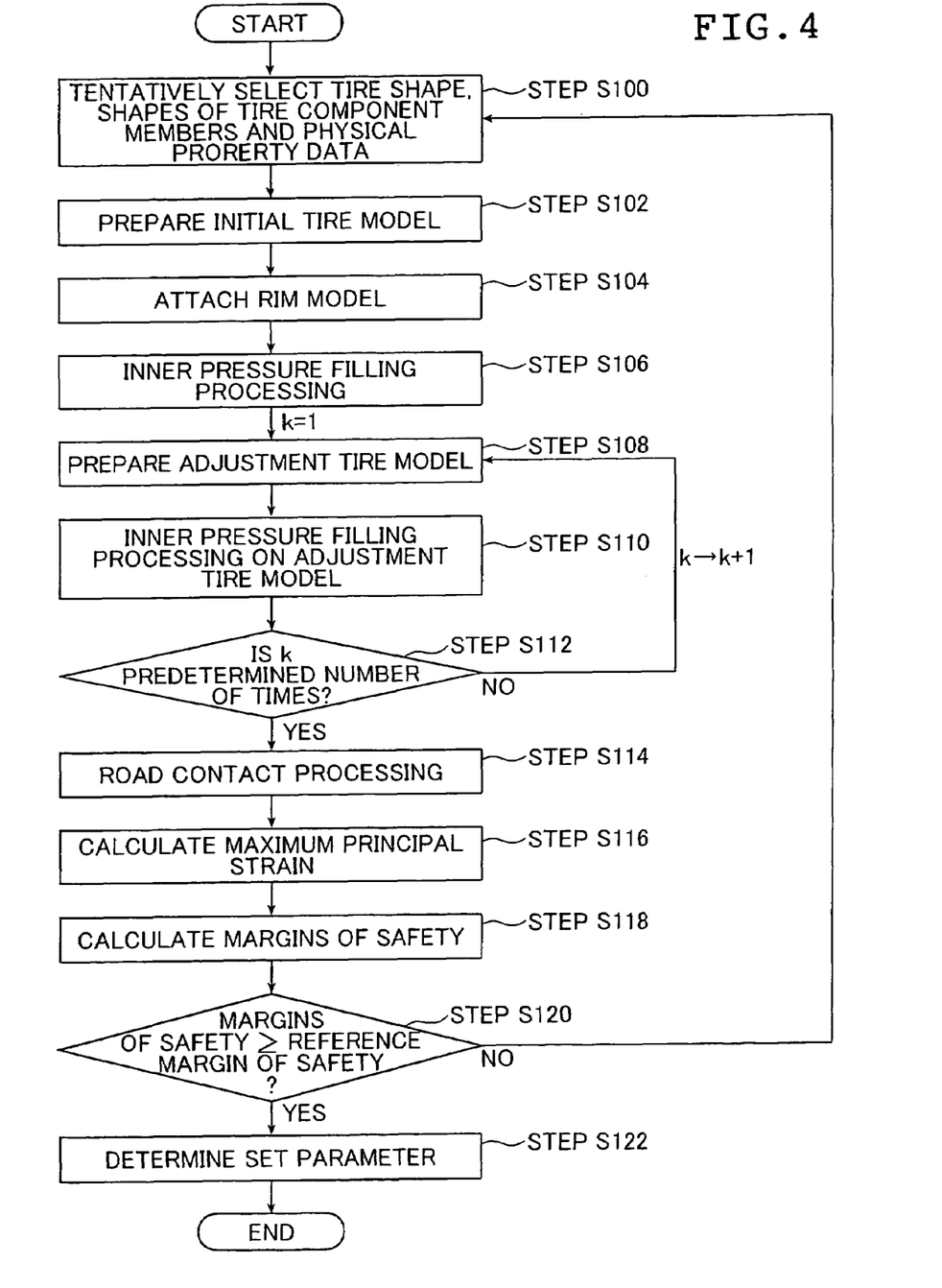
FIG. 4 is a flowchart showing a flow of an example of the tire designing method according to the present invention.

FIG. 4 is a flowchart showing a flow of the tire designing method executed in the apparatus 40.

First, corresponding to entered input information, the tire profile shape, the shapes of the tire component members and the physical property data of the tire component members are tentatively selected in the model preparing section 42 (step S100).

The input information corresponds to the range of tentative selection for automatically tentatively selecting the tire profile shape, the shapes of the tire component members and the physical property data of the tire component members, tentative selection rules and the like. The tentative selection is performed in a random manner from the selectable range of tentative selection or corresponding to the input and set rules.

Although the tire profile shape, the shapes of the tire component members and the physical property data of the tire component members are tentatively selected, it is sufficient to tentatively select at least one of the tire profile shape, the shapes of the tire component members and the physical property data of the tire component members in the present invention. In this case, unselected ones in the tentative selection are fixed to those which are preset.

Next, an initial tire model of a finite element model is prepared using the tire profile shape, the shapes of the tire component members and the physical property data of the tire component members which are tentatively selected (step S102).

Specifically, information of a geometrical shape of each of the finite elements and node positional information of each of the finite elements, which are required to prepare the tire model, are prepared from the tire profile shape and the shapes of the tire component members. The physical property data of the respective finite elements are set to be the same corresponding to the physical property data of the tire component member. As a result, the tire model 30 as shown in FIG. 2 is prepared as the initial tire model.

Next, the initial tire model is attached to the preset rim model (step S104).

The rim model is, for example, a rigid model that does not allow any deformation. The steps S100 to S104 are performed in the model preparing section 42.

Next, in the time-varying change predicting section 44, an inner pressure filling processing (a first inner pressure filling processing) is performed on the initial tire model to which the rim model is attached (step S106).

The inner pressure filling processing is a processing of uniformly applying a pressure on the inner circumferential face side of the initial tire model while a part of the initial tire model, for example, the vicinity of the bead is being partially retained by the rim model.

Next, in the time-varying change predicting section 44, an adjustment tire model having the tire shape of the initial tire model deformed by the inner pressure filling processing as a tire shape before an inner pressure filling processing (a third inner pressure filling processing) and a value obtained by modifying a stress acting on the initial tire model by the inner pressure filling processing (the first inner pressure filling processing) as an initial stress is prepared (step S108). At this time, an initial value 1 is set as the number of processing times k.

Herein, the adjustment tire model may be prepared by replacing nodal coordinates of each of the elements of the initial tire model with nodal coordinates of each of the elements of the initial tire model deformed by the inner pressure filling processing (the first inner pressure filling processing) or may be obtained by repreparing geometrical information of nodes and elements and the like while a contour shape and a member border line profile of the initial tire model deformed by the inner pressure filling processing (the first inner pressure filling processing) are retained. Specifically, the initial stress is applied to the tire model having the tire shape of the initial tire model deformed by the inner pressure filling processing (the first inner pressure filling processing) by mapping.

The pressure applied in the inner pressure filling processing is not necessarily limited to an inner pressure as a usage condition of the tire. It is sufficient to apply a preset pressure.

As the initial stress, a value obtained by subtracting the stress acting on the initial tire model, for example, a value modified by multiplying the stress acting on the initial tire model after the inner pressure filling processing by a factor such as 0.2 is used. In this case, a value equal to or larger than 0 and smaller than 1.0 is sufficient as the value of the factor, and a preset value is used. The factor may be varied for each of the elements corresponding to the belt member and the carcass member.

The stress herein includes a stress in any of a tensile direction and a compressive direction.

Thereafter, the inner pressure filling processing (the third inner pressure filling processing) is performed on the prepared modified tire model (step S110). In this manner, the steps S108 and S110 are repeated for a predetermined number of times (step S112). The last prepared adjustment tire model is used as a tire model that has changed with time. Specifically, if it is denied (if "NO"), 1 is added to the number of processing times k. Then, the processing returns to the step S108. Until the number k of performing each step of the steps S108 and S110 reaches a predetermined number of repeat times, a new adjustment tire model having the tire shape corresponding the tire shape deformed by the inner pressure filling processing (the third inner pressure filling processing) is prepared as a tire shape before the inner pressure filling processing (the third inner pressure filling processing) and a value obtained by modifying the stress acting on the adjustment tire model by the inner pressure filling processing (the third inner pressure filling processing) as an initial stress is prepared.

In this manner, the processing is repeated until the number k reaches the predetermined number of repeat times while returning the adjustment tire model, which is subjected to the inner pressure filling processing in the step S110, to the step S108. In the present invention, the steps S108 and S110 correspond to a modification processing.

The number of repeat times of the above-described modification processing is set corresponding to a measure of elapsed time of the tire shape desired to be predicted. For example, a running distance of the tire is used as a measure of elapsed time. The repeat number is increased as the running distance becomes longer. Alternatively, by using the fact that tread member is worn away by running to reduce a groove depth, a ratio of a groove depth to a groove depth in the initial state may be used. It is recommended that the repeat number be increased as the groove depth ratio becomes smaller.

When a plurality of measures are set for elapsed time, the number of repeat times differs for each of the measures. Therefore, a plurality of tire models that have changed with time, whose tire shapes change corresponding to the measures of elapsed time, are prepared.

The measure of elapsed time is a parameter indicating elapsed time for the use of the tire. The measure has complete additivity, according to which values of the measures indicating elapsed time for the respective uses are accumulatively added when the use of the tire occurs separately. Generally, the measure is a mathematical abstract concept such as a length, an area, a volume and time.

As the physical property data used for each element of each tire component member of the adjustment tire model prepared in the step S108, the tentatively selected physical property data may be varied depending on the measure of elapsed time. For example, as the number of processing times k of the adjustment tire model increases, the physical property data such as an elastic modulus or a Poisson ratio can be modified to be varied. Herein, the elastic modulus and the Poisson ratio can be set corresponding to a change of a strain-stress curve, which can be preexamined by a deterioration test of the rubber member. As a result, the effects of the deterioration of the rubber member on a change in tire shape with time can also be taken into consideration.

The modification of the physical property data herein is for reproducing deterioration with time, which is produced with the use of the tire. In the case of an isotropic material model, the elastic modulus is generally set to be elevated. For example, the elastic modulus is set as a function of a state variable such as usage time, a running distance or a temperature. The state variable function can be experimentally obtained. For example, the state variable function can be obtained by using the result of deterioration of the physical property data with time, which is obtained as a result of a laboratory aging test or a material property test. Alternatively, in a laboratory drum test or a vehicle running test, a sample piece of the tire running for a predetermined distance or a predetermined time may be extracted to measure the physical property data to obtain the state variable function. Moreover, as the state variable in the function, a state variable normalized between 0 and 1 may be used or a value itself having physical meaning as in the case of a running distance may be used.

The correlation between the state variable and the above-mentioned measure of elapsed time are experimentally obtained in advance. The state variable is obtained based on the measure of elapsed time, which is set to predict a change with time. It is recommended that the physical property data be set corresponding to the obtained state variable. As a result, the physical property data deteriorated with time can be set.

In the inner pressure filling processing in the step S110, as in the inner pressure filling processing in the step S106, a pressure to be applied is not necessarily limited to the inner pressure as a usage condition of the tire. It is only necessary to apply a preset pressure. However, for the inner pressure used in the inner pressure filling processing the second inner pressure filling processing performed on the adjustment tire model after the steps S108 and S110 are executed for a predetermined number of times, the inner pressure is set as a usage condition of the tire.

If it is affirmed (if "YES") in the step S112, the last prepared adjustment tire model is used as a tire model that has changed with time.

The processing in the steps S106 to S112 is performed in the time-varying change predicting section 44.

As described above, the tire model that has changed with time can be obtained by repeating the steps S108 and S110 because the inventors of the present invention found the following fact.

The change in tire shape with time, which is produced with the use of the tire, has: a growth phase that starts at the early stage of the use of the tire, in which the tire shape greatly changes; and a subsequent stable phase, in which the tire shape is stabilized to scarcely change.

Figure 5:
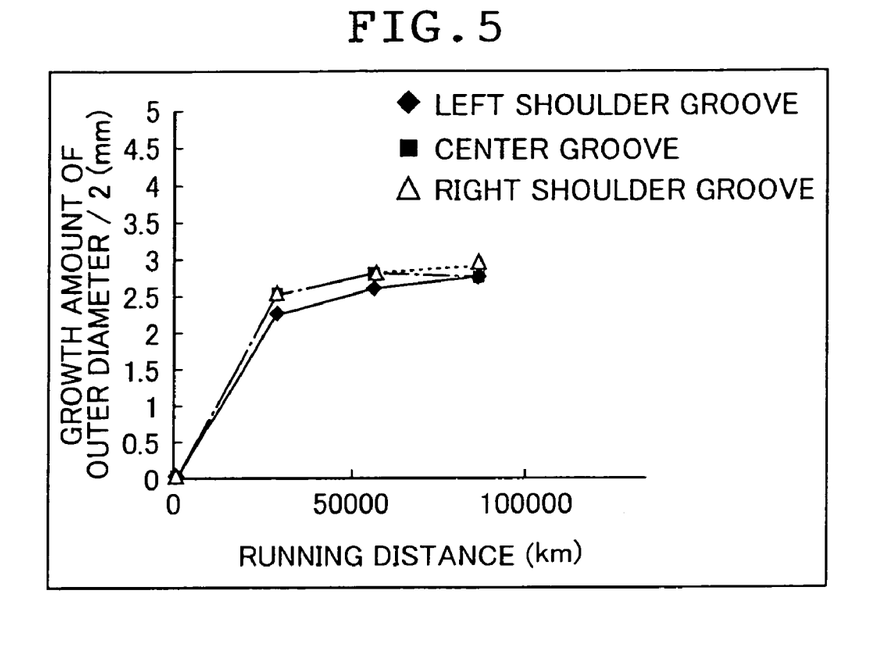
FIG. 5 is a view illustrating an example of a change of a pneumatic tire with time.

FIG. 5 shows an example of the growth amount of a tire outer diameter of a heavy-duty tire. The marks "■", "◆" and "Δ" are plots indicating the growth amounts of the outer diameter/2, which are respectively obtained by dividing the growth amounts of the outer diameter at positions of three grooves in a tire circumferential direction (at a center position, a right shoulder position, and a left shoulder position), which are provided in a tire width direction, by 2. Each of the plots shows the growth amount of the outer diameter greatly changes up to a running distance of 50,000 km, which causes the tire shape to change. For a larger running distance, the growth amount of the outer diameter does not greatly change, thereby the tire shape does not change greatly. In this manner, the value of the outer diameter/2 is ultimately increased by about 3 mm as compared with that at the early stage of the use of the tire (in other words, the growth amount of the outer diameter is about 6 mm). Therefore, it is understood that even the tire shape in a desired phase is different from the initial tire shape. Accordingly, the tire properties are greatly affected by the tire shape greatly deformed from the initial tire shape.

Figure 6:
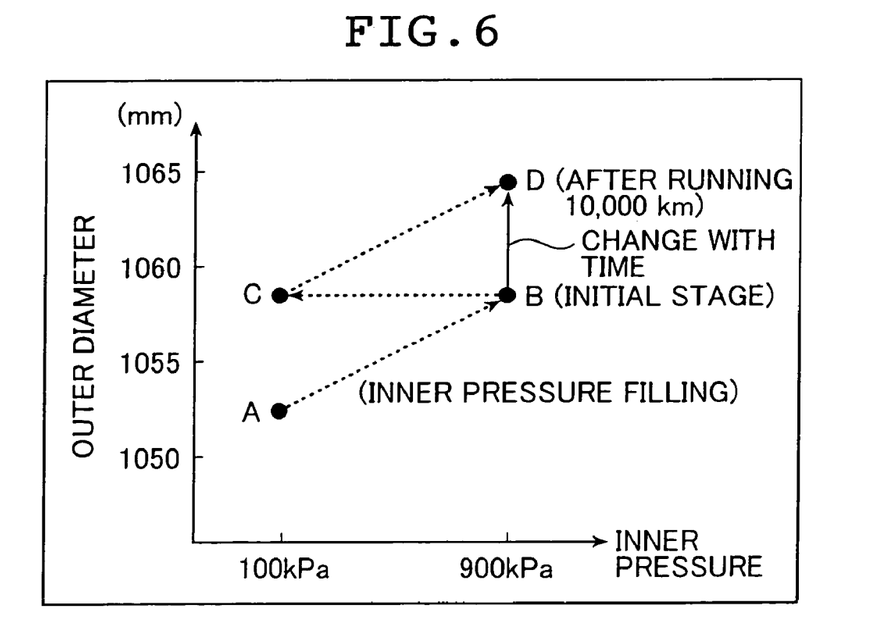
FIG. 6 is an explanatory view illustrating a change of the pneumatic tire with time.

FIG. 6 shows an example of the relation between the outer diameter of the tire and the inner pressure at the early stage of the use of the tire and after running 10,000 km.

A point A indicates the outer diameter when the inner pressure of the tire in the early stage of the use is 100 kPa, a point B indicates the outer diameter when the tire is filled with the inner pressure of 900 kPa corresponding to one usage condition, a point C indicates the outer diameter when the inner pressure is 100 kPa after running 10,000 km, and a point D indicates the outer diameter when the inner pressure is 900 kPa after running 10,000 km. The inner pressure 100 kPa is an inner pressure at which approximately the same tire shape as that at the inner pressure of 0 when the tire is attached to the rim is demonstrated. Therefore, each of the points A and C can be regarded as indicating the outer diameter at the inner pressure of approximately 0.

According to the relation of the inner pressure and the outer diameter of the tire as described above, the outer diameter (the point B) grown by filling the tire in the initial state (unused tire) with the inner pressure is obtained. On the other hand, the outer diameter (the point D) after running 10,000 km grows from the outer diameter (the point C) after running 10,000 km before the inner pressure filling. The outer diameter before the inner pressure filling (the point C) is approximately the same as the outer diameter of the tire filled with the inner pressure in the initial state (the point B) (the point B: 1,057.1 mm and the point C: 1,057.7 mm). Therefore, it is believed that the tire shape at the point C and that at the point B are approximately the same.

Specifically, it is believed that the shape of the tire becomes approximately identical with that after running 10,000 km when the tire having a tire shape in the initial state after the inner pressure filling treated as a tire shape prior to the inner pressure filling, is filled with the inner pressure.

Therefore, by preparing the adjustment tire model having the tire shape of the initial tire model deformed by the inner pressure filling processing as the tire shape prior to the inner pressure filling processing, the tire shape after a predetermined running distance can be predicted. The number of repeat times of changing the tire shape by the inner pressure filling processing as described above is determined corresponding to the measure of elapsed time such as the running distance. Specifically, the relation between the running distance and the change in tire shape with time for each of several kinds of tire is obtained in advance by the laboratory drum test or the vehicle running test. At the same time, the relation between the number of repeat times of the above-described steps S108 and S110 and the change in tire shape in the tire model is obtained. Furthermore, by using the obtained relations, the relation between the running distance and the number of repeat times is obtained to determine the number of repeat times corresponding to the running distance. The tire shape after the laboratory drum test or the vehicle running test can be obtained by an X-ray CT scanner, a laser profile measurement system or the like. In the case of the vehicle running test, the tread member is worn away. Therefore, the tire shape that has changed with time may be obtained at high accuracy by using the position of the bottom of a groove of the tread pattern.

In order to precisely predict the tire shape, the inner pressure in the inner pressure filling processing and the initial stress applied to the adjustment tire model are set as modification parameters. It is suitable that the parameters are predefined in comparison with an actual change in tire shape with time.

As described above, it is believed that the processing of performing at least one inner pressure filling processing using the tire shape of the tire model deformed by the inner pressure filling processing as the tire shape prior to the inner pressure filling processing simulates a reduction in the stress acting on the interior of the tire filled with the inner pressure in the initial state owing to a viscoelastic property of the tire component member.

The thus prepared tire model after the change with time is evaluated for durability. When a plurality of measures of elapsed time are set, a plurality of tire models after the change with time are prepared for the different measures of elapsed time. Each of the tire models is evaluated for durability.

Specifically, a predetermined load is applied to a predetermined tread to perform the road contact processing on the tire model after the change with time in the road contact processing section 46 (step S114).

Subsequently, the maximum principal strain is calculated for the tire model being subjected to the road contact processing (step S116).

The principal strains of each of the elements corresponding to the tire component members are extracted from the result of calculation of the tire model being subjected to the road contact processing. From the principal strains, the maximum principal strain of each of the elements is obtained.

More specifically, in the tire model being subjected to the road contact processing, since even elements (i) representing the same tire component member are deformed with a distribution profile on the tire circumference, the principal strains of each of the elements (i) change at a position on the circumference of the tire. Therefore, in each of the elements (i), the largest one of the principal strains having a distribution profile on the circumference of the tire is extracted as the maximum principal strain $\epsilon_{max}$.

Next, a margin of safety is calculated by using the maximum principal strain $\epsilon_{max}$ (step S118).

For the calculation of the margin, a margin of safety $S_{ia}$ safety factor based on strain is obtained by the following Formula (1) using the maximum principal strain $(\epsilon_i)_{max}$ and a breaking strain $(\epsilon_i)_b$ set corresponding to the measure of elapsed time.

$$S_{ia}=(\epsilon_i)_b/(\epsilon_i)_{max} \quad (1)$$

Here, the breaking stain $(\epsilon_i)_b$ is a characteristic value proper to a material of the tire component member corresponding to each element for which the margin $S_{ia}$ is to be obtained, which varies corresponding to the measure of elapsed time. More specifically, the breaking stain $(\epsilon_i)_b$ decreases with the measure of elapsed time. The degree of how it decreases varies for each rubber material. Such a breaking stain $(\epsilon_i)_b$ is obtained in advance by a laboratory test or the like to be stored.

Figure 7:
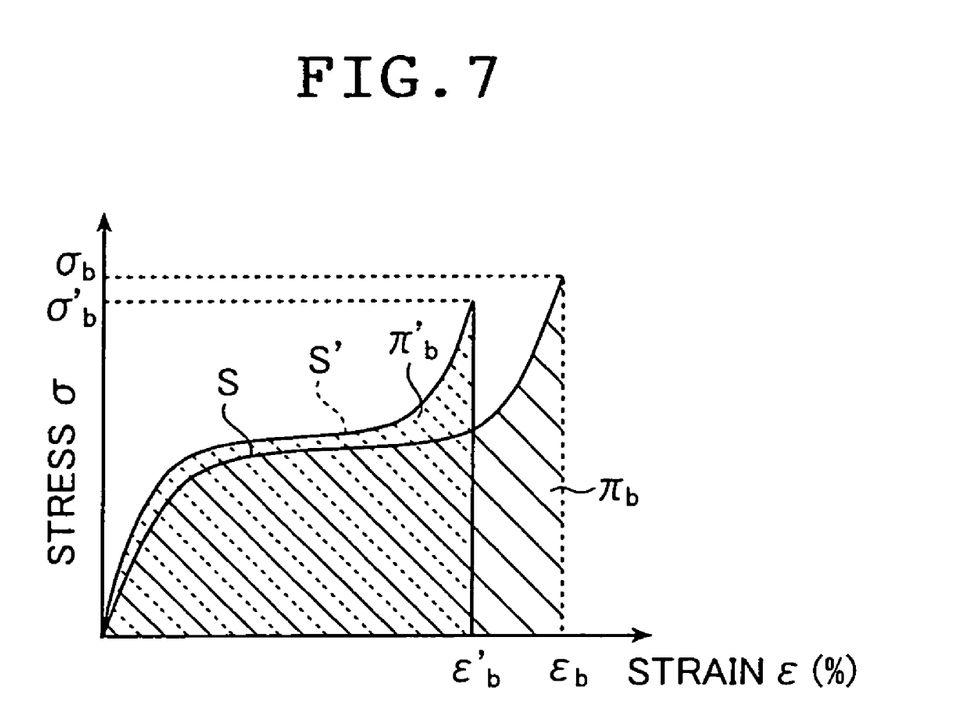
FIG. 7 is a view showing an example of a stress-strain curve of a rubber member.

For example, if the tire component member is a rubber member, a mechanical characteristic represented by a stress-strain curve as shown in FIG. 7 is obtained by a laboratory test for the rubber member. Specifically, the mechanical characteristic is as is represented by a curve S when the rubber member is new and as is represented by a curve S' corresponding to a predetermined measure of elapsed time. The mechanical characteristics when the tire component member is new and the mechanical characteristics corresponding to the predetermined measure of elapsed time are respectively defined as breaking strains $\epsilon_b$ and $\epsilon_b'$ to be stored. It is preferred to store the breaking strain $\epsilon_b$ to be correlated with a plurality of measures of time for predicting a change with time, for example, running distances of 2,000 (km) and 5,000 (km).

If the tire component member is a composite member of a cord of the carcass member 12, the belt member 14, or the like and a rubber member, a mechanical characteristic is evaluated by using a composite material theory to store its breaking strain in advance. For the details, for example, reference can be made to "Recent FRP mechanics and its applications" (Journal of the Society of Rubber Industry, Japan, Vol. 61, No. 3, page 187 (1988)).

Next, it is determined whether or not all the calculated margins $S_{ia}$ are equal to or larger than a preset reference margin of safety $S_0$ (Step S120).

The reference margin $S_0$ is a predetermined value, for example, in the range of 5 to 30. If the reference margin $S_0$ is lower than 5, a problem occurs in the durability of the designed tire. On the other hand, if the reference margin $S_0$ is set to be large to exceed 30, the weight of the tire, the cost of a material or the like increases to be impractical for use. More preferably, in the case of a passenger tire for a passenger vehicle, the reference margin is set within the range of 5 to 20. In the case of a heavy-duty tire for a bus, a track, and the like, the reference margin is set within the range of 7 to 30.

When all the margins $S_{ia}$ are equal to or larger than the reference margin $S_0$, the tire shape, the shapes of the tire component members, and the physical property data of the tire component members, which are tentatively selected, are determined as design parameters (step S122).

If at least one margin $S_{ia}$ is smaller than the reference margin $S_0$ in the step S120, that is, a negation is taken in the step S120, the processing returns to the step S100 to perform the processing in the steps S100 to S120. In this manner, until an affirmation is taken in the step S120, the processing in the steps S100 to S120 is repeated.

The processing in the steps S116 to S122 is performed in the tire model determining section 50.

It is preferable that a rule is predefined to tentatively select the tire shape, the shapes of the tire component members or the physical property data of the tire component members to allow the reversal of the magnitude relation between the margin $S_{ia}$ and the reference margin $S_0$ when the margin $S_{ia}$ is smaller than the reference margin $S_0$. Moreover, if the margin $S_{ia}$ is sufficiently larger than the reference margin $S_0$ in a specific tire component member of the tire, a predetermined rule may be given to the tentative selection so that the margin $S_{ia}$ of the member is lowered to elevate the margin of the surrounding of the member.

Although the margins of safety are calculated for the elements of all the tire component members in this embodiment, the present invention is not limited thereto. The margin of safety can be calculated only for a predetermined area of the tire. For example, in a pneumatic radial tire, it is empirically known that a serious crack leading to tire failure is likely to be generated, in particular, in a rubber material at the end of the belt member 14 (a belt edge portion) and a rubber material in the vicinity of a turned edge (a turnup portion) of the carcass material 12. Therefore, the margins $S_{ia}$ may be calculated for the areas such as the belt edge portion and the turnup portion to determine the margins of safety only for those areas to determine the design parameters of the tire.

In the above-described embodiment, the durability is evaluated based on the margin $S_{ia}$ in the tire model being subjected to the road contact processing (the step S114) in an unrotating state. However, the margin $S_{ia}$ may be obtained in the tire model in a rotating state when the tire model rotates at a predetermined running speed or rotates at a predetermined slip angle to make a cornering motion.

Figure 8A:
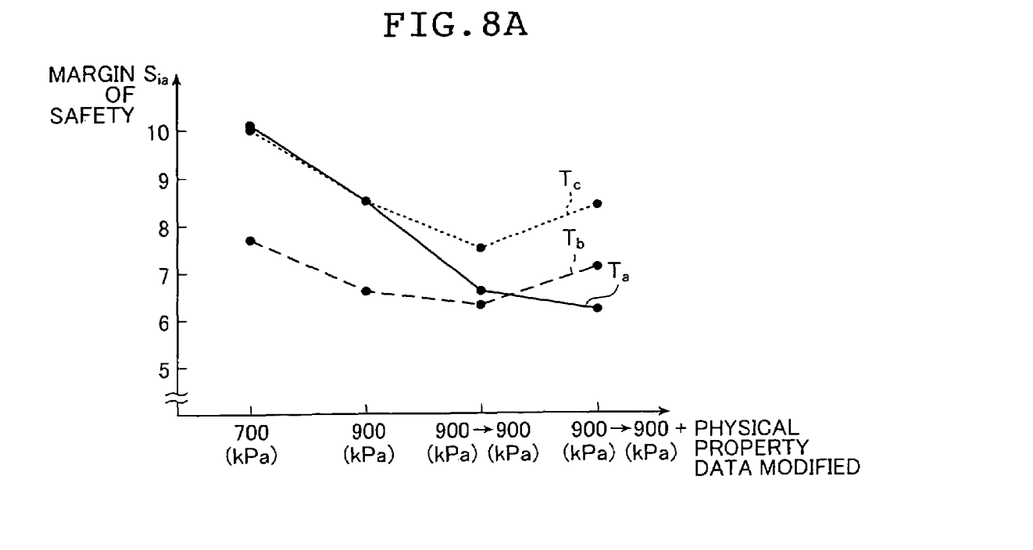
FIGS. 8A and 8B are views showing a change in margin of safety and maximum principal strain obtained by the tire designing method according to the present invention, respectively.
Figure 8B:
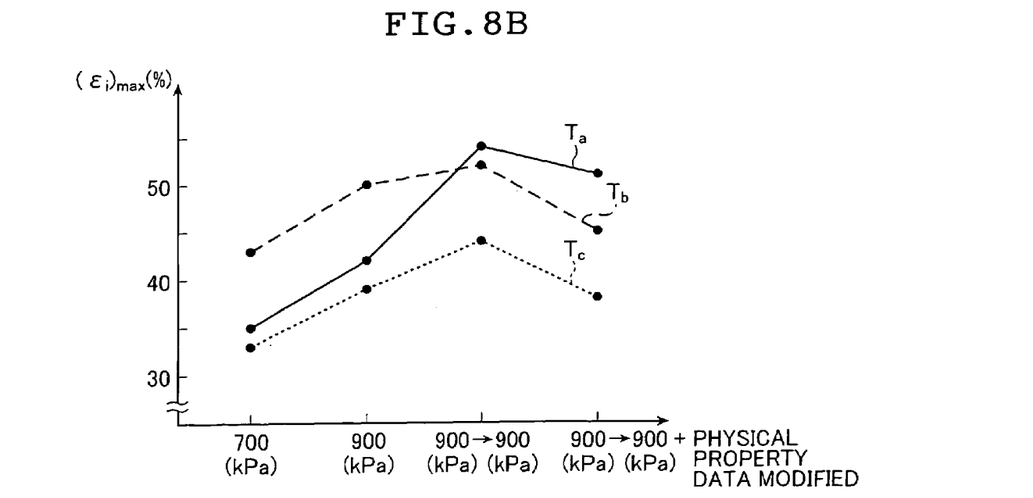

FIG. 8A is a graph showing a change in the margin $S_{ia}$ of the belt edge portion, which is calculated from each of different initial tire models $T_a$, $T_b$ and $T_c$ (tire models of the heavy-duty tire, having size of 11R22.5) in the grounded state, whereas FIG. 8B is a graph showing a change in the maximum principal strain (%) of the belt edge part, calculated from each of the initial tire models $T_a$, $T_b$ and $T_c$. The road contact processing is performed with a load of 3,250 (kgf).

The initial tire models $T_b$ and $T_c$ have different tire shapes and shapes of the tire component members but have the same physical property data for the tire component member. The initial tire model $T_a$ has different tire shape, shape of the tire components and physical property data of the tire component members from those of initial tire models $T_b$ and $T_c$ have.

An abscissa axis in FIGS. 8A and 8B indicates a difference due to a difference in inner pressure in the tire model at the inner pressures of 700 (kPa) and 900 (kPa), which indicates a difference in the margin $S_{ia}$ at the different inner pressures when the tire is new. On the other hand, "900 (kPa)→900

(kPa)" indicates the margin $S_{ia}$ in the tire model after a predetermined change with time when the processing in steps S108 and S110 is performed once at the inner pressure of 900 (kPa). The abscissa axis "900(kPa)→900 (kPa)+physical property data modified" indicates the margin $S_{ia}$ when the physical property data used for the tire model is modified in consideration of deterioration of the rubber member with time.

According to the above graphs, the following is understood. In the tire models of the new tire, even for the initial tire model $T_a$ having the margin $S_{ia}$ equal to or larger than that of the tire model $T_b$, the magnitude relation of the margins $S_{ia}$ is reversed in the tire models that have changed with time (the tire models indicated at the "900(kPa)→900 (kPa)+physical property data modified"). As a result, the margin $S_{ia}$ of the tire model $T_b$ becomes larger than the margin $S_{ia}$ of the tire model $T_a$. Even in FIG. 8B showing the maximum principal strain $(\epsilon_i)_{max}$, the reversed magnitude relation is shown.

As described above, the durability of the tire after a change with time, which cannot be assumed by conventional analysis of a tire model of a new tire, can be predicted by calculating the margin $S_{ia}$ of the tire model being subjected to the above-described processings to predict the tire that has changed with time. By using the margin, a tire excellent in durability can be designed.

The thus designed tire can be used to manufacture a tire.

Although the ratio of the breaking strain to the maximum principal strain is used as the margin of safety $S_{ia}$ in the above-described embodiment, a margin of safety $S_{ib}$ safety factor based on stress may be calculated as the following formula (2) using a maximum principal stress $(\sigma_i)_{max}$ and a breaking stress $(\sigma_i)_b$ in place of the maximum principal strain and the breaking strain. Alternatively, a margin of safety $S_{ic}$ safety factor based on strain energy density may be calculated as the following formula (3) using a maximum strain energy density $(\Pi_i)_{max}$ and a breaking strain energy density $(\Pi_i)_b$ in place of the maximum principal strain and the breaking strain.

The breaking stress $(\sigma_i)_b$ is a stress at the breakage as shown in FIG. 7, whereas the breaking strain energy density $(\Pi_i)_b$ corresponds to the amount of a hatched area surrounded by the stress-strain curve shown in FIG. 7 (a breaking strain energy density $(\Pi_i')_b$ at a predetermined measure of elapsed time corresponds to the amount of a hatched area surrounded by the curve S').

$$S_{ib}=(\sigma_i)_b/(\sigma_i)_{max} \quad (2)$$

$$S_{ic}=((\Pi_i)_b/(\Pi_i)_{max})^{(1/2)} \quad (3)$$

The strain energy density $\Pi$ has the relation established by the following formula (4) with the strain $\epsilon$.

$$\Pi=(1/2)\cdot E\cdot\epsilon^2 \quad (4)$$

Therefore, for the margin $S_{ic}$ obtained by using the strain energy density, a square root of the ratio of the breaking strain energy density $(\Pi_i)_b$ to the maximum strain energy density $(\Pi_i)_{max}$ is calculated.

For the calculated margins $S_{ib}$ and $S_{ic}$, the determination as that in the step S120 is performed as in the case of the margin $S_{ia}$. It is apparent that two of or all of the margins $S_{ia}$, $S_{ib}$ and $S_{ic}$ may be used for the determination in the step 120.

The above-described tire designing method can be applied on a computer by execution of a program.

For example, the program has the following procedures.

(1) A model preparing procedure of tentatively selecting at least one of the tire profile shape, the shapes of the tire component members and the physical property data of the tire component members as a parameter to allow a CPU (a central processing unit) of a computer to prepare the initial tire model using a finite number of elements to represent the pneumatic tire;

(2) An inner pressure filling processing procedure of allowing the CPU to perform the calculation of the inner pressure filling processing on the prepared initial tire model;

(3) A time-varying change predicting procedure of allowing the CPU to modify at least one of the stress acting on the initial tire model by the inner pressure filling processing in the procedure (2) and the physical property data used for the initial tire model corresponding to a predetermined measure of elapsed time to deform the initial tire model and allowing the CPU to predict the tire profile shape after a change with time by using the deformed initial tire model;

(4) A margin of safety calculating procedure of allowing the CPU to execute at least the calculation of the inner pressure filling processing of the tire model after the change with time, which has the tire profile shape after the change with time, to calculate at least one mechanical characteristic quantity of the maximum principal strain, the maximum principal stress and the maximum strain energy density in each of the elements of the tire component members in the tire model after the change with time and allowing the CPU to calculate the margins of safety of the tire component members in the tire model after the change with time by using the thus calculated mechanical characteristic quantity, whereby the margins are stored in a memory of the computer;

(5) A repeat procedure of allowing the computer to repeat (1) the model preparing procedure, (2) the inner pressure filling processing procedure, (3) the time-varying change predicting procedure and (4) the margin of safety calculating procedure until the calculated margins become equal to or larger than the reference margin of safety; and (6) A parameter determining procedure of allowing the computer to determine the tentatively selected parameter, with which the calculated margins become equal to or larger than the reference margin, as a design parameter.

Although the tire designing method and the program according to the present invention have been described above in detail, the present invention is not limited to the embodiment described above. It is apparent that various modifications and changes are possible without departing from the scope of the present invention.

INDUSTRIAL APPLICABILITY

As described above in detail, according to the present invention, at least one of the stress acting on the initial tire model and the physical property data used for the initial tire model is modified corresponding to a predetermined measure of elapsed time to deform the initial tire model. By using the deformed initial tire model, the tire profile shape after a change with time is predicted to enable the designing of a tire excellent in durability.

What is claimed is:

1. A tire designing method of designing a tire by predicting a change with time, which is caused by use of a pneumatic tire, the method including:

a model preparing step of tentatively selecting at least one of a tire profile shape, a shape of a tire component member and physical property data of the tire component member as a parameter to prepare an initial tire model representing the pneumatic tire by using a finite number of elements;

an inner pressure filling processing step of performing a first inner pressure filling processing on the prepared initial tire model;

a time-varying change predicting step of modifying at least one of a stress acting on the initial tire model by the first inner pressure filling processing and the physical property data used for the initial tire model corresponding to a predetermined measure of elapsed time to deform the initial tire model and predicting a tire profile shape after a change with time by using the deformed initial tire model;

a margin of safety calculating step of performing at least a second inner pressure filling processing on the tire model after the change with time, the tire model having the tire profile shape after the change with time, to calculate at least one mechanical characteristic quantity of a maximum principal strain, a maximum principal stress and a maximum strain energy density in each element of the tire component member in the tire model filled with the inner pressure after the change with time and calculating margins of safety of the tire component member by using the thus calculated mechanical characteristic quantity;

a repeat step of repeating the model preparing step, the inner pressure filling processing step, the time-varying change predicting step and the margin of safety calculating step until the calculated margins become equal to or larger than a preset reference margin of safety; and a parameter determining step of determining the tentatively selected parameter, with which the margins become equal to or larger than the reference margin, as a design parameter of a tire.

2. The tire designing method according to claim 1, wherein the measure of elapsed time is determined by a ratio of a groove depth of a remaining groove of a tire tread portion to an initial groove depth or a running distance of a pneumatic tire, a plurality of different measures of elapsed time are given in the time-varying change predicting step to predict a change of the tire with time at a plurality of time stages, and the model preparing step, the inner pressure filling processing step, the time-varying change predicting step and the margin of safety calculating step are repeated until all the margins of safety of the changes of the tire with time at the plurality of time stages become equal to or larger than the reference margin in the repeat step.

3. The tire designing method according to claim 1, wherein a road contact processing on the tire model is performed in addition to the second inner pressure filling processing in the margin of safety calculating step.

4. The tire designing method according to claim 1, wherein in the time-varying change predicting step, when the initial tire model is deformed to predict the tire profile shape after a change with time, an adjustment tire model is prepared, the adjustment tire model having a tire profile shape of the initial tire model deformed by the first inner pressure filling processing as a tire profile shape before a subsequent third inner pressure filling processing.

5. The tire designing method according to claim 4, wherein the adjustment tire model has as an initial stress a value obtained by modifying a stress acting on the initial tire model when the first inner pressure filling processing is performed on the initial tire model.

6. The tire designing method according to claim 1, wherein in the time-varying change predicting step, the tire profile shape after the change with time is predicted by deforming the initial tire model, a third inner pressure filling processing is performed for a plurality of times, and when defining as a modification processing a processing of preparing an adjustment model having the tire profile shape of the tire model deformed by the third inner pressure filling processing as the tire profile shape prior to the further third inner pressure filling processing, the modification processing is performed using a tire model first to be subjected to the modification processing as the initial tire model deformed by the first inner pressure filling processing and the adjustment tire model prepared by the modification processing is used as a tire model to be further subjected to the modification processing where the modification processing is repeated for a predetermined number of times, and a tire profile shape of the last prepared adjustment tire model is predicted as a tire profile shape of the pneumatic tire after the change with time.

7. The tire designing method according to claim 6, the adjustment tire model prepared by the modification processing has as an initial stress a value obtained by modifying the stress acting on the tire model when the third inner pressure filling processing is performed on the tire model to be subjected to the modification processing.

8. The tire designing method according to claim 1, wherein at least one of an elastic modulus and a Poisson ratio is modified corresponding to a measure of elapsed time of the pneumatic tire as the modification of the physical property data in the time-varying change predicting step, when the physical property data of the tire component member in the initial tire model is modified.

9. A program executable by a computer, for predicting a change with time caused by use of a pneumatic tire to allow the computer to design a tire, the program including:

a model preparing procedure of allowing computing means of a computer to tentatively select at least one of a tire profile shape, a shape of a tire component member and a physical property data of the tire component member as a parameter and allowing the computing means to prepare an initial tire model representing the pneumatic tire by using a finite number of elements;

an inner pressure filling processing procedure of allowing the computing means to perform a calculation of a first inner pressure filling processing performed on the prepared initial tire model;

a time-varying change predicting procedure of allowing the computing means to modify at least one of a stress acting on the initial tire model by first the inner pressure filling processing and the physical property data used for the initial tire model corresponding to a predetermined measure of elapsed time to deform the initial tire model and allowing the computing means to predict a tire profile shape after a change with time by using the deformed initial tire model;

a margin of safety calculating procedure of allowing the computing means to execute at least a calculation of a second inner pressure filling processing of the tire model after the change with time, which has a tire profile shape after the change with time, to calculate at least one mechanical characteristic quantity of a maximum principal strain, a maximum principal stress and a maximum strain energy density in each of the elements of the tire component members in the tire model after the change with time and allowing the computing means to calculate a margin of safety of the tire component member in the tire model after the change with time by using the thus calculated mechanical characteristic quantity, whereby the margin is stored in storage means of the computer;

a repeating procedure of allowing the computer to repeat the model preparing procedure, the inner pressure filling processing procedure, the time-varying change predicting procedure and the margin of safety calculating procedure until the calculated margins become equal to or larger than a reference margin of safety; and a parameter determining procedure of allowing the computer to determine the tentatively selected parameter, with which the calculated margins become equal to or larger than the reference margin, as a design parameter of a tire.

* * * * *